United States Patent
Farnworth et al.

(10) Patent No.: US 6,297,660 B2
(45) Date of Patent: Oct. 2, 2001

(54) TEST CARRIER WITH VARIABLE FORCE APPLYING MECHANISM FOR TESTING SEMICONDUCTOR COMPONENTS

(75) Inventors: Warren M. Farnworth, Nampa; Salman Akram, Boise; James M. Wark, Boise; Derek Gochnour, Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/734,514

(22) Filed: Dec. 12, 2000

Related U.S. Application Data

(62) Division of application No. 09/231,347, filed on Jan. 13, 1999.

(51) Int. Cl.[7] .................................................. G01R 31/26
(52) U.S. Cl. ............................................. 324/765; 324/755
(58) Field of Search .................................... 324/754, 755, 324/758, 757, 765, 762, 158.1

(56) References Cited

U.S. PATENT DOCUMENTS

| | | |
|---|---|---|
| 5,088,190 | 2/1992 | Malhi et al. . |
| 5,123,850 | 6/1992 | Elder et al. . |
| 5,408,190 | 4/1995 | Wood et al. . |
| 5,483,741 | 1/1996 | Akram et al. . |
| 5,495,179 | 2/1996 | Wood et al. . |
| 5,519,332 | 5/1996 | Wood et al. . |
| 5,541,525 | 7/1996 | Wood et al. . |
| 5,572,140 | 11/1996 | Lim et al. . |
| 5,634,267 | 6/1997 | Farnworth et al. . |
| 5,686,317 | 11/1997 | Akram et al. . |
| 5,691,649 | 11/1997 | Farnworth et al. . |
| 5,739,050 | 4/1998 | Farnworth . |
| 5,783,461 | 7/1998 | Hembree . |
| 5,796,264 | 8/1998 | Farnworth et al. . |
| 5,801,452 | 9/1998 | Farnworth et al. . |
| 5,815,000 | 9/1998 | Farnworth et al. . |
| 5,825,195 | 10/1998 | Hembree et al. . |
| 5,834,945 | 11/1998 | Akram et al. . |
| 5,844,418 | 12/1998 | Wood et al. . |
| 5,878,485 | 3/1999 | Wood et al. . |
| 5,915,977 | 6/1999 | Hembree et al. . |
| 5,949,242 | 9/1999 | Wood et al. . |
| 5,962,921 | 10/1999 | Farnworth et al. . |
| 6,013,948 | 1/2000 | Akram et al. . |
| 6,016,060 | 1/2000 | Akram et al. . |
| 6,018,249 | 1/2000 | Akram et al. . |
| 6,022,750 | 2/2000 | Akram et al. . |
| 6,025,728 | 2/2000 | Hembree et al. . |
| 6,025,730 | 2/2000 | Akram et al. . |
| 6,025,731 | 2/2000 | Hembree et al. . |
| 6,040,239 | 3/2000 | Akram et al. . |
| 6,040,702 | 3/2000 | Hembree et al. . |
| 6,060,894 | 5/2000 | Hembree et al. . |

(List continued on next page.)

Primary Examiner—Ernest Karlsen
Assistant Examiner—Minh Tang
(74) Attorney, Agent, or Firm—Stephan A. Gratton

(57) ABSTRACT

A semiconductor carrier for testing semiconductor components, such as bare dice and chip scale packages, and a method for testing components using the carrier, are provided. The carrier includes a base, an interconnect for making temporary electrical connections with the component, and a force applying mechanism for biasing the component against the interconnect. The force applying mechanism includes an elastomeric biasing member adapted to apply a relatively large biasing force during assembly of the carrier and a smaller biasing force in the assembled carrier. The force applying mechanism also includes a pressure plate which can include a cushioning layer with a non-stick surface for contacting the component. In addition, the cushioning layer, and elastomeric biasing member can be made of conductive elastomers to provide an electrical path from a backside of the component.

18 Claims, 5 Drawing Sheets

U.S. PATENT DOCUMENTS

| | | |
|---|---|---|
| 6,064,216 | 5/2000 | Farnworth et al. . |
| 6,072,323 | 6/2000 | Hembree et al. . |
| 6,072,326 | 6/2000 | Akram et al. . |
| 6,091,251 | 7/2000 | Wood et al. . |
| 6,094,058 | 7/2000 | Hembree et al. . |
| 6,107,109 | 8/2000 | Akram et al. . |
| 6,107,119 | 8/2000 | Farnworth et al. . |
| 6,114,240 | 9/2000 | Akram et al. . |
| 6,130,148 | 10/2000 | Farnworth et al. . |
| 6,175,241 * | 1/2001 | Hembree et al. .................. 324/755 |
| 6,188,232 | 2/2001 | Akram et al. . |
| 6,208,156 | 3/2001 | Hembree . |
| 6,208,157 | 3/2001 | Akram et al. . |
| 6,215,322 | 4/2001 | Farnworth et al. . |

\* cited by examiner

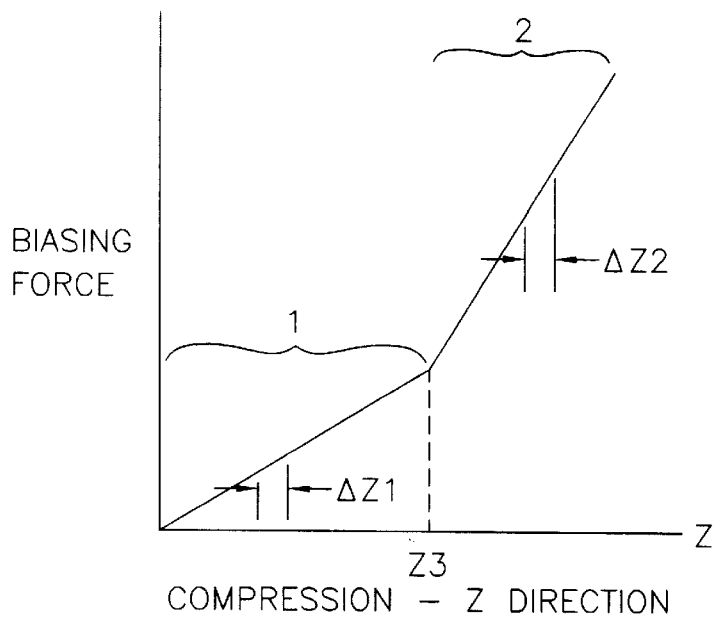
FIGURE 2A
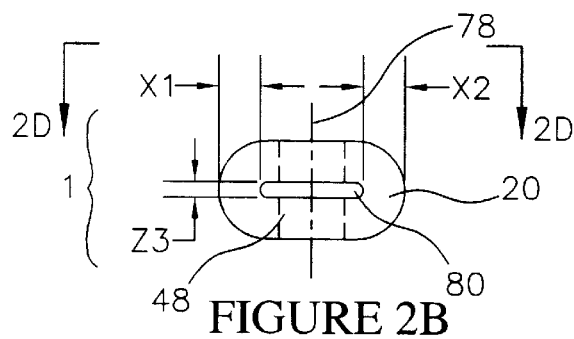
FIGURE 2B
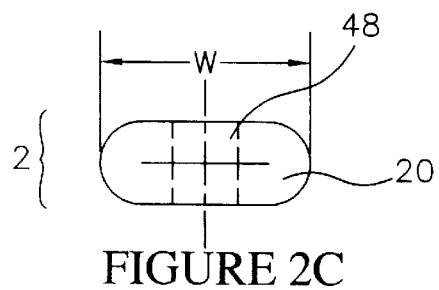
FIGURE 2C
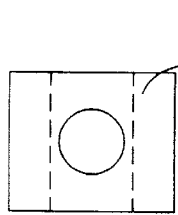   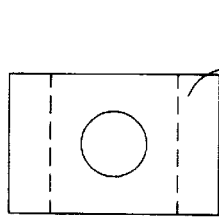   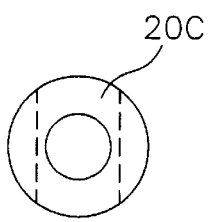   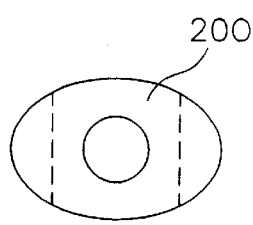
FIG. 2D      FIG. 2E      FIG. 2F      FIG. 2G

TEST CARRIER WITH VARIABLE FORCE APPLYING MECHANISM FOR TESTING SEMICONDUCTOR COMPONENTS

CROSS REFERENCE TO RELATED APPLICATIONS

This application is a division of patent application Ser. No. 09/231,347 filed on Jan. 13, 1999.

FIELD OF THE INVENTION

This invention relates generally to semiconductor manufacture, and more particularly to an improved test carrier for temporarily packaging and testing semiconductor components, such as bare dice and chip scale packages. This invention also relates to a test system incorporating the carrier, and to test methods employing the carrier.

BACKGROUND OF THE INVENTION

Semiconductor components, such as bare dice and chip scale packages, must be tested prior to shipment by semiconductor manufacturers. Since these components are relatively small and fragile, carriers have been developed for temporarily packaging the components for testing. The carriers permit electrical connections to be made between external contacts on the components, and testing equipment such as burn-in boards. On bare dice, the external contacts typically comprise planar or bumped bond pads. On chip scale packages, the external contacts typically comprise solder balls in a dense array, such as a ball grid array, or a fine ball grid array.

An interconnect component of the carrier includes contacts that make the temporary electrical connections with the external contacts on the components. The interconnect provides power, ground and signal paths to the component. A force applying mechanism of the carrier applies a biasing force for biasing the component against the interconnect. Typically, the force applying mechanism includes a biasing member such as a metal, or elastomeric spring for applying the biasing force. In addition, the force applying mechanism can include a clamp, or a latch plate, for securing the biasing member to a base of the carrier.

One aspect of this type of carrier is that the biasing force is determined by the geometry and construction of the force applying mechanism. This biasing force is fixed when the carrier is assembled, and the biasing member presses the component against the interconnect. However, it would be advantageous to be able to adjust this biasing force during and subsequent to assembly of the carrier.

For example, a relatively large biasing force is required during initial contact of the component with the interconnect. The large biasing force is required for making reliable temporary electrical connections with the contacts on the component. Solder balls, for example, can be retained in a conductive pocket, or penetrated with conductive projections. The large biasing force is necessary for penetrating native oxide layers present to make low resistance electrical connections. However, once the electrical connections are made with the component contacts, the biasing force does not need to be as large. Also, if the carrier and component are heated during testing, such as in a burn-in oven, the contacts expand, and lower biasing forces are sufficient to maintain the electrical connections.

The present invention is directed to a carrier that includes a biasing member constructed to provide a variable biasing force. In particular, the biasing force can be large during initial assembly of the carrier, and smaller following assembly and during operation of the carrier.

SUMMARY OF THE INVENTION

In accordance with the present invention, an improved test carrier, an improved test system incorporating the carrier, and an improved test method employing the carrier, are provided. The test carrier can be used to temporarily package and test semiconductor components, such as bare dice, and chip scale packages. The carrier includes a base for retaining one or more components, and an interconnect having contacts for making temporary electrical connections with contacts on the component. The carrier also includes a force applying mechanism for biasing the component against the interconnect. The force applying mechanism includes a biasing member formed of an elastomeric material such as silicone, butyl rubber, fluorosilicone, and polyimide. The biasing member is configured to apply a relatively large biasing force during assembly of the carrier, and a smaller biasing force in the assembled carrier.

The variable biasing force is achieved by the geometry of the biasing member. Specifically, compression of the biasing member by a sufficient amount changes the shape of the biasing member, and causes the biasing force to be greater for each increment of compression.

In a first embodiment, the biasing member comprises a tubular element that is flattened during assembly of the carrier. Flattening of the biasing member provides a relatively large biasing force with each increment of compression, such that reliable electrical connections are made between contacts on the interconnect and the component during assembly of the carrier. During assembly, flattening and compression of the biasing member is achieved by overdriving the biasing member in the z-direction using an assembly tool. Following assembly, the biasing member returns to a tubular shape in the assembled carrier, such that a smaller biasing force is exerted with each increment of compression. In the assembled carrier the amount of compression of the biasing member is fixed by the geometry of the carrier and biasing member. These geometries can be selected to provide a biasing force that is just large enough to maintain reliable electrical connections with the component during burn-in and other tests procedures.

In a second embodiment, the biasing member has a wave shape. The biasing member is flattened during assembly of the carrier, then returns to the wave shape in the assembled carrier. In a third embodiment, the biasing member has an accordion shape. Again, the biasing member is flattened during assembly of the carrier, then returns to the accordion shape in the assembled carrier. In both embodiments the biasing force with each compressive increment varies, depending on the shape of the biasing member.

In addition to the biasing member, the force applying mechanism includes a clamp which attaches to the base, and a pressure plate which is pressed by the biasing member against the component. The pressure plate can include an elastomeric layer for evenly applying the biasing force exerted by the biasing member to the component. In addition, the elastomeric layer can include a metal or polymer outer layer, which prevents adhesion of the elastomeric layer to the surface of the component. Further, the elastomeric layer, pressure plate and biasing member can comprise electrically conductive materials, to provide an electrical path from a backside of the component during testing. One suitable conductive material for the elastomeric layer and biasing member comprises silicone filled with graphite or metal particles.

A method for testing a component in accordance with the invention includes the initial step of providing a carrier comprising a base, an interconnect, and a force applying mechanism having a biasing member configured to exert a variable biasing force. The method also includes the step of assembling the carrier by flattening the biasing member in the z-direction, to provide a relatively large biasing force for making electrical connections between contacts on the component and the interconnect. Following the assembly step, the method includes the step of allowing the biasing member to expand in the z-direction in the assembled carrier, to provide a smaller biasing force for testing the component.

A test system constructed in accordance with the invention includes the carrier and test circuitry. The test circuitry generates and transmits test signals through the carrier to the component, and evaluates the resultant signals. The test system can also include a burn-in board which provides electrical interface between the carrier and test circuitry.

BRIEF DESCRIPTION OF THE DRAWINGS

FIG. 2A is a graph plotting force versus compression in the z-direction for the biasing member;

FIG. 2B is a schematic side elevation view of the biasing member prior to being overdriven in the z-direction;

FIG. 2C is a schematic view of the biasing member shown as flattened and overdriven in the z-direction;

FIG. 2D is a plan view taken along section line 2D—2D of FIG. 2B showing a peripheral shape for the biasing member;

FIGS. 2E–2G are plan views equivalent to FIG. 2D showing differein peripheral shapes for the biasing member;

DETAILED DESCRIPTION OF THE PREFERRED EMBODIMENTS

Figure 1A:
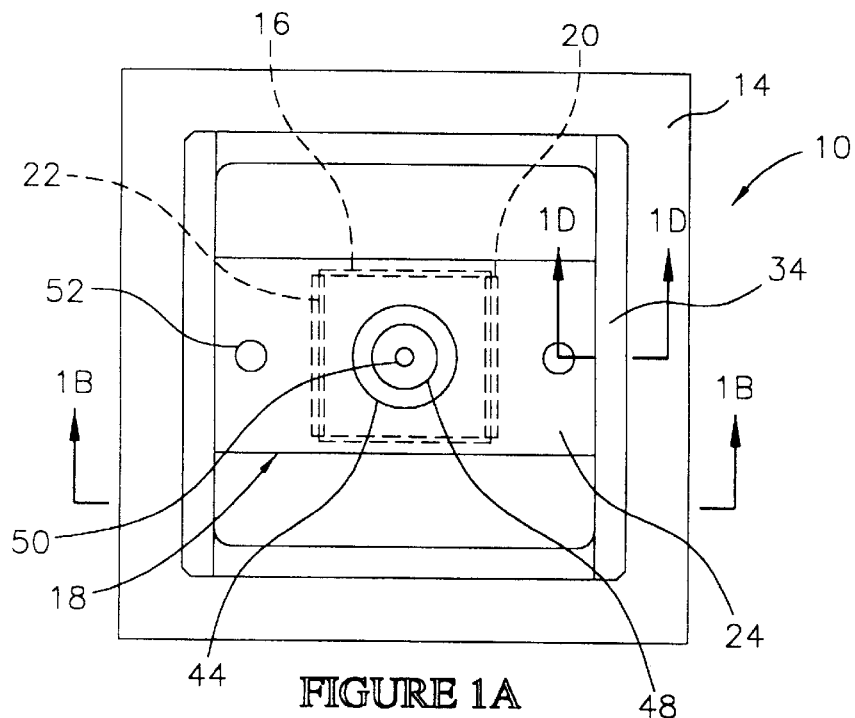
FIG. 1A is a plan view of a carrier constructed in accordance with the invention.

Referring to FIGS. 1A–1D, a carrier 10 constructed in accordance with the invention is illustrated. The carrier 10 is adapted to temporarily package a semiconductor component 12 (FIG. 1B) for testing and burn-in.

The carrier 10 includes a base 14, and an interconnect 16. The carrier 10 also includes a force applying mechanism 18 comprising a biasing member 20 (FIG. 1B), a pressure plate 22, and a clamp 24. In addition, the carrier 10 includes a plurality of terminal leads 26 in electrical communication with the interconnect 16.

Figure 1B:
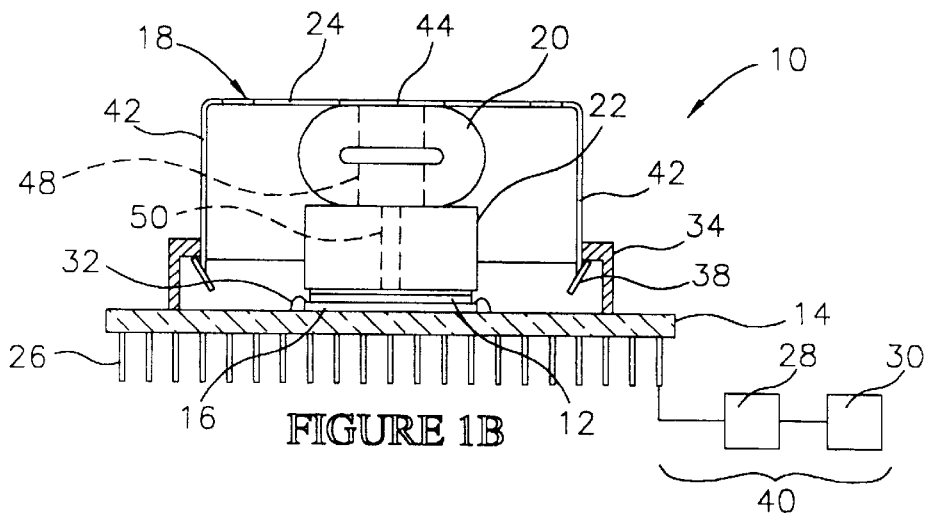
FIG. 1B is a cross sectional view of the carrier taken along section line 1B—1B of FIG. 1A.

The terminal leads 26 are adapted for electrical communication with a burn-in board 28 (FIG. 1B) and test circuitry 30 (FIG. 1B). The test circuitry 30 generates test signals, and transmits the test signals to the terminal leads 26, and through the interconnect 16 to the component 12. The test circuitry 30 also analyzes the resultant test signals transmitted from the component 12. The carrier 10, burn-in board 28 and test circuitry form a test system 40 (FIG. 1B) which permits various electrical characteristics of the component 12 to be evaluated.

In the illustrative embodiment, the terminal leads 26 comprise pins formed in a pin grid array (PGA) on a backside of the base 14. Alternately, other configurations for the terminal leads 26 can be provided. For example, the carrier base 14 can include ball contacts in a ball grid array (BGA) or fine ball grid array (FBGA).

Also in the illustrative embodiment, the base 14 comprises a laminated ceramic material. A ceramic lamination process can be used to fabricate the base 14 with a desired geometry, and with metal features such as internal conductors and external pads. U.S. Pat. No. 5,519,332, entitled "Carrier For Testing An Unpackaged Semiconductor Die", which is incorporated herein by reference, describes a ceramic lamination process for fabricating the base 14.

Alternately, rather than ceramic, the base 14 can comprise plastic and the metal features formed using a 3-D molding process. U.S. patent application Ser. No. 08/615,119, filed Mar. 13, 1996, now U.S. Pat. No. 5,878,485, entitled "Carrier For Testing An Unpackaged Semiconductor Die, which is incorporated herein reference, describes a 3-D molding process for fabricating the base 14.

Rather than ceramic or plastic, the base can also comprise a glass reinforced plastic (e.g., FR-4) similar to materials used for circuit boards. In this case, conventional plastic substrate fabrication processes, as described in *Ball Grid Array Technology*, by John H. Lau, McGraw-Hill Inc. (1995), can be used for fabricating the base 14.

The base 14 includes internal conductors (not shown) in electrical communication with the terminal leads 26. As will be further explained, bond wires 32 (FIG. 1B) are wire bonded to bond pads on the base 14 in electrical communication with the internal conductors in the base 14. The bond wires 32 (FIG. 1B) are also wire bonded to the interconnect 16, and establish electrical communication between the terminal leads 26 on the base 14, and contacts 62 (FIG. 1E) on the interconnect 16.

The base 14 also includes a clamp ring 34 for attaching the clamp 24 of the force applying mechanism 18 to the base 14 during assembly of the carrier 10. The clamp ring 34 is attached to the base 14, and as shown in FIG. 1A, has a frame-like configuration. As shown in FIG. 1D, the clamp ring 34 includes grooves 36 wherein the clamp 24 is attached.

In the illustrative embodiment, the clamp ring 34 comprises metal, and is attached to the base 14 using a brazing process. One suitable metal for the clamp ring 34 comprises tungsten coated with gold. The base 14 can include bonding features, such as metal pads, for attaching the clamp ring 34. In addition, as will be further explained, the clamp ring 34 can be in electrical communication with one or more terminal leads 26 on the base 14, for providing a ground path from a backside of the component 12.

The clamp 24 comprises a flexible bridge-like structure formed of a resilient material such as steel. The clamp 24 includes tabs 38 that physically engage the grooves 36 on the clamp ring 34. In addition, the clamp 24 includes opposed sides 42 movable towards one another to permit engagement of the tabs 38 on the clamp 24, with the grooves 36 on the clamp ring 34. The clamp 24 also includes an opening 44 which provides access to the component 12 for a vacuum assembly tool during assembly of the carrier 10. The biasing member 20 also includes an opening 48, and the pressure plate 22 includes an opening 50 for the vacuum assembly tool. A pair of openings 52 (FIG. 1A) can also be provided on the clamp 24 for manipulation of the clamp 24 by the vacuum assembly tool during assembly of the carrier.

The pressure plate 22A can also be formed of a metal, plastic, or ceramic material. For applications in which a conductive path must be provided from the backside of the component 12, the pressure plate 22A can comprise metal or a conductive polymer. A peripheral shape and thickness of the pressure plate 22A can be selected as required.

Assembly of the carrier can be accomplished manually, or using an automated assembly apparatus. U.S. Pat. No. 5,796,264, entitled "Apparatus For Manufacturing Known Good Semiconductor Dice", which is incorporated herein by reference, describes a method and apparatus for assembling the carrier. Briefly, during the assembly procedure the component 12, pressure plate 22, biasing member 20 and clamp 24 are held by the vacuum assembly tool as the component 12 is aligned with the interconnect 16. The component 12 is then placed in contact with the interconnect 16 as the sides 42 of the clamp 24 are depressed, and the tabs 38 (FIG. 1D) are placed in the grooves 36 (FIG. 1D) on the clamp ring 34.

In the illustrative embodiment, alignment of the component 12 with the interconnect 16 can be performed using an optical alignment technique. Such an optical alignment technique is described in the above cited U.S. Pat. No. 5,796,264. Alignment of the component 12 with the interconnect 16 can also be performed using a mechanical alignment fence on the base 14, or on the interconnect 16. U.S. patent application Ser. No. 08/988,433, filed Dec. 11, 1997, now U.S. Pat. No. 6,018,249, entitled, "Test System With Mechanical Alignment For Semiconductor Chip Scale Packages And Dice", which is incorporated herein by reference, describes an exemplary mechanical alignment fence.

Figure 1C:
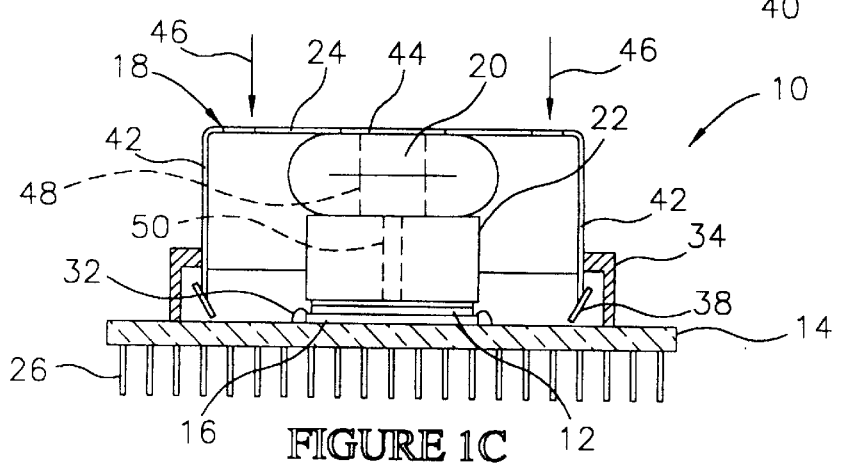
FIG. 1C is a cross sectional view of the carrier during equivalent to FIG. 1B wherein a biasing member of the carrier is overdriven in the z-direction and fully compressed.
Figure 1D:
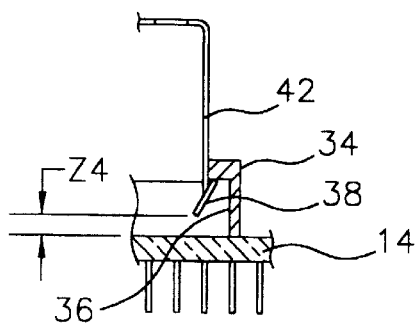
FIG. 1D is an enlarged cross sectional view of the carrier taken along section line 1D—1D of FIG. 1A.

As shown in FIG. 1C, during assembly of the carrier 10, the clamp 24 is also overdriven in the z-direction, as indicated by force arrows 46, to flatten the biasing member 20. As will be further explained, flattening of the biasing member 20 provides a relatively large biasing force for making initial electrical connections between the component 12 and interconnect 16. As used herein, the term "overdrive" refers to z-direction movement of the clamp 24 and biasing member 20 following initial contact of the component 12 and the interconnect 16. This movement flattens and almost fully compresses the biasing member 20, such that a relatively large biasing force is applied by the biasing member 20 during assembly of the carrier 10 for making initial electrical connections between the component 12 and the interconnect 16. However, following assembly of the carrier 10, the biasing member applies a lesser biasing force for maintaining the electrical connections. The lesser biasing force is a function of the geometry of the carrier and biasing member. The overdrive and biasing functions of the carrier 10, and biasing member 20, will be more fully described as the description proceeds.

Figure 1E:
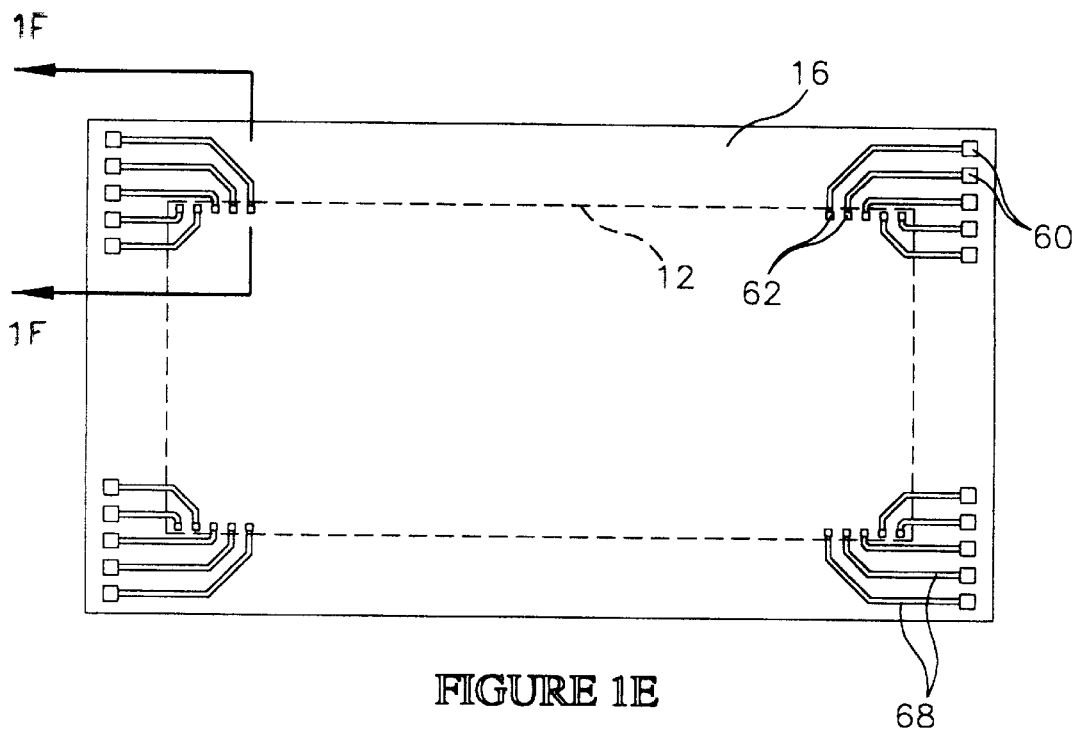
FIG. 1E is a plan view of an interconnect of the carrier shown separately from the carrier and with an outline of the component superimposed thereon in dotted lines.
Figure 1F:
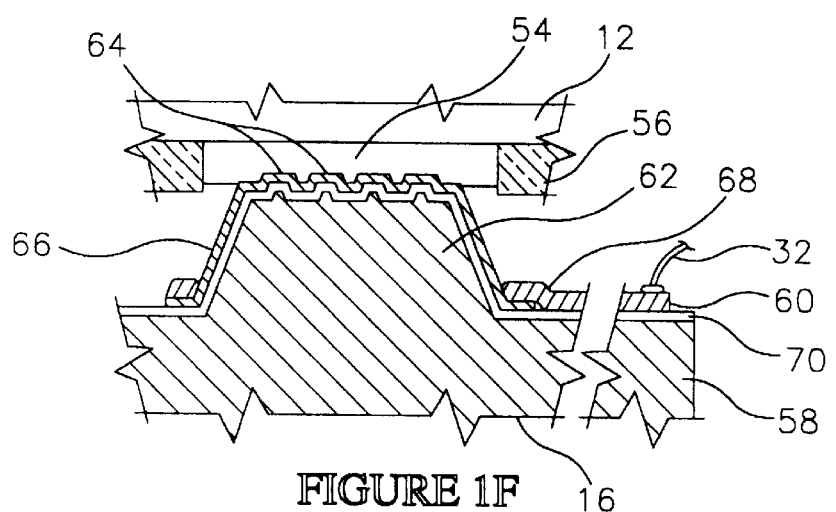
FIG. 1F is an enlarged cross sectional view taken along section line 1F—1F of FIG. 1E showing a contact on the interconnect electrically engaging a planar contact on the component.

Referring to FIGS. 1E and 1F, further details of the interconnect 16 are illustrated. In the embodiment illustrated in FIGS. 1E and 1F, the interconnect 16 includes patterns of interconnect contacts 62 configured to electrically engage component contacts 54 on the component 12. As shown in FIG. 1F, the component contacts 54 comprise thin film, planar bond pads embedded in a passivation layer 56. The component contacts 54 are in electrical communication with the integrated circuits contained on the component 12. This type of contact 54 typically occurs on a bare semiconductor die suitable for testing using the carrier 10, for certification as a known good die (KGD).

The interconnect contacts 62 can be formed integrally with a substrate 58 (FIG. 1F) of the interconnect 16. Preferably, the substrate 58 comprises silicon, such that a coefficient of thermal expansion (CTE) of the interconnect 16 matches that of components 12 formed of silicon. Alternately, germanium, a reinforced glass resin material, or a ceramic material, can be used as the substrate material.

As shown in FIG. 1F, the interconnect contacts 62 include penetrating projections 64 adapted to penetrate the component contacts 54 to a limited penetration depth. In addition, the interconnect contacts 62 include conductive layers 66 adapted to electrically contact the component contacts 54. The conductive layers 66 are in electrical communication with patterns of conductors 68 formed on a surface of the interconnect 16. The conductors 68 include, or are in electrical communication with, bond pads 60. The bond pads 60 are wire bonded to bond wires 32 (FIG. 1F), such that electrical paths are provided between the conductors 68 and the terminal leads 26 (FIG. 1B) on the base 14 (FIG. 1B).

As also shown in FIG. 1F, the interconnect 16 includes an insulating layer 70 formed on the substrate 58 to electrically insulate the conductors 68 and conductive layers 66 from a bulk of the substrate 58. Further details of the interconnect 16, including methods of fabrication, are disclosed in U.S. Pat. No. 5,483,741, entitled "Method For Fabricating A Self Limiting Silicon Based Interconnect For Testing Bare Semiconductor Dice", and U.S. Pat. No. 5,686,317, entitled "Method For Fabricating An Interconnect Having A Penetration Limited Contact Structure For Establishing A Temporary Electrical Connection With A Semiconductor Die", both of which are incorporated herein by reference.

Figure 1G:
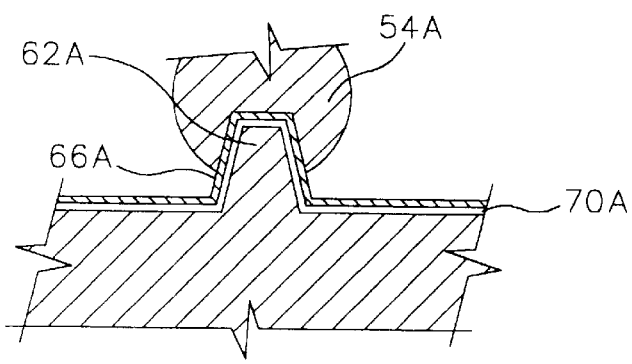
FIG. 1G is an enlarged cross sectional view equivalent to FIG. 1F of an alternate embodiment contact on the interconnect electrically engaging a ball contact on the component.

Referring to FIG. 1G, an alternate embodiment interconnect contact 62A is illustrated. The interconnect contact 62A is configured to penetrate and electrically engage a ball contact 54A on the component 12. In this embodiment the ball contact 54A can comprise a solder ball on a bumped die, or chip scale package. Typically the ball contact 54A will be contained in a dense array such as a ball grid array (BGA), or fine ball grid array (FBGA). The interconnect contact 62A comprises a projection covered with a conductive layer 66A. As in the previous embodiment, an insulating layer 70A electrically insulates the conductive layer 66A from a remainder of the interconnect 16. In addition, the conductive layer 66A can be in electrical communication with conductors 68 (FIG. 1E) on the interconnect 16 substantially as previously described. The interconnect contact 62A can be fabricated substantially as previously described for interconnect contact 62 (FIG. 1F).

Figure 1H:
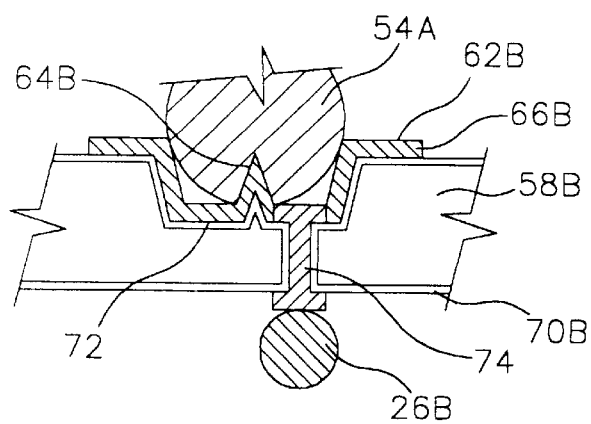
FIG. 1H is an enlarged cross sectional view equivalent to FIG. 1F of an alternate embodiment contact on the interconnect electrically engaging a hall contact on the component.

Referring to FIG. 1H, an alternate embodiment interconnect contact 62B is illustrated. As with the previous embodiment, the interconnect contact 62B is adapted to form an electrical connection with a ball contact 54A on the component 12.

The interconnect contact 62B comprises a pocket 72 formed in the interconnect substrate 58B. The pocket 72 is sized and shaped to retain the ball contact 54A. The interconnect contact 62B also includes a conductive layer 66B covering the pocket 72, and penetrating projections 64B formed within the pocket 72. The conductive layer 66B is in electrical communication with a conductor 68 (FIG. 1E) on the interconnect 16 substantially as previously described. The penetrating projections 64B are configured to penetrate the ball contact 54A. In addition, insulating layer 70B insulates the conductive layer 66B and conductors 68.

Still referring to FIG. 1H, the interconnect contact 62B also includes a conductive via 74 in electrical communication with the conductive layer 66B. The conductive via 74 also includes a terminal lead 26B. The terminal lead 26B is substantially equivalent to the terminal leads 26 (FIG. 1B) previously described, but comprises a ball contact, such as a solder ball. As with the ball contacts 54A on the component 12, the terminal lead 26B can be contained in a dense array such as a ball grid array (BGA) or fine ball grid array (FBGA).

One method for forming the conductive via 74 comprises laser machining an opening in the substrate 58B, etching the opening (e.g., KOH or TMAH wet etch), insulating the opening with insulating layer 70B, and then filling the opening with a conductive material (e.g., metal or conductive polymer). The terminal lead 26B can be attached to the conductive via 74 by soldering, brazing, or welding, preformed metal balls to the conductive via 74. Alternately, a ball bumper apparatus can be used to attach a pre-formed metal ball to the conductive via 74 to form the ball terminal lead 26B.

Further details of the interconnect contact 62B, and conductive via 74, including methods of fabrication, are described in U.S. patent application Ser. No. 08/993,965 filed Dec. 18, 1997, now U.S. Pat. No. 6,107,109, entitled "Semiconductor Interconnect Having Laser Machined Contacts", which is incorporated herein by reference. A method for fabricating the interconnect contact 66B is also described in U.S. patent application Ser. No. 08/829,193, filed Mar. 31, 1997, now U.S. Pat. No. 5,962,921, entitled "Interconnect Having Recessed Contact Members For Testing Semiconductor Dice And Packages With Contact Bumps", which is incorporated herein by reference.

Figure 1I:
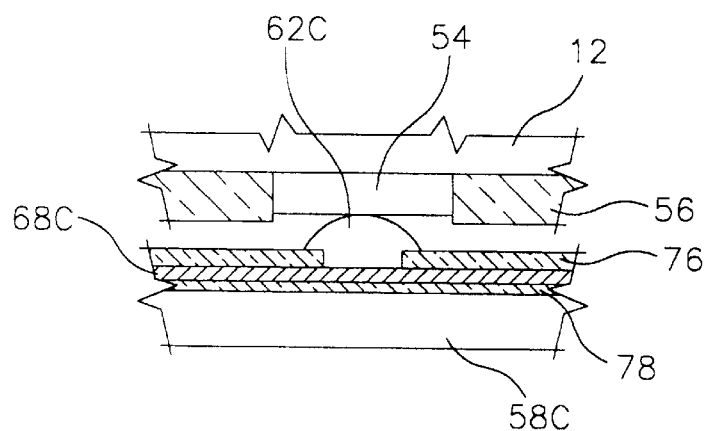
FIG. 1I is an enlarged cross sectional view equivalent to FIG. 1F of an alternate embodiment contact on the interconnect electrically engaging a ball contact on the component.

Referring to FIG. 1I, an alternate embodiment interconnect contact 62C is illustrated. The interconnect contact 62C comprises a metal microbump formed on polymer tape 76 similar to multi layered TAB tape. In this embodiment a compliant adhesive layer 78 attaches the polymer tape 76 to a substrate 58C of the interconnect 16. In addition, conductors 68C equivalent to conductors 68 (FIG. 1E) can comprise patterned metal foil laminated to the polymer tape 76. Further details of the interconnect contact 62C, including methods of fabrication, are described in U.S. Pat. No. 5,678,301 entitled "Method For Forming An Interconnect For Testing Unpackaged Semiconductor Dice".

Referring to FIGS. 2A–2C, further details of the biasing member 20 are illustrated. As shown in FIG. 2A, the biasing member 20 is configured to exert a variable biasing force as a function of compression in the z-direction. In FIG. 2A, the horizontal axis is termed the z-axis and represents compression of the biasing member 20 in the z-direction. Curve segment 1 of the curve on the graph represents the biasing force exerted by the biasing member 20 in the assembled carrier 10. Curve segment 2 of the curve on the graph represents the biasing force exerted by the biasing member, as it is overdriven in the z-direction during assembly of the carrier. As shown in FIG. 2A, an increment of compression (z2) on curve segment 2, produces a greater mount of biasing force than an increment of compression (z1) on curve segment 1.

As shown in FIG. 2B, in the illustrative embodiment the biasing member 20 has a generally tubular, or donut shape. The biasing member 20 includes a central axis 78 which is generally parallel to the z-axis of FIG. 2A. The biasing member 20 also includes access opening 48 which provides access for the assembly tool to the component 12 during assembly of the carrier 10. The access opening 48 is generally parallel, or coincident, to the central axis 78.

As also shown in FIG. 2B, the biasing member 20 includes an opening 80 which provides a geometry for producing the variable biasing force during compression of the biasing member 20. The opening 80 has a height z3. If the biasing member 20 is compressed by a distance greater than z3, then the opening closes to the configuration shown in FIG. 2C, and initiates curve segment 2 in FIG. 2A. In this configuration of the biasing member 20, the biasing force is exerted across the full width w of the biasing member 20. However, in the initial configuration of the biasing member 20 shown in FIG. 2B, the biasing force is only exerted across segments x1 and x2. As the area and volume of segments x1 and x2 is less than the area and volume of the full width w of the biasing member, the slope of curve segment 1 is less than that of curve segment 2.

Flattening of the biasing member 20 to the configuration of FIG. 2C, can be achieved by overdriving the clamp 24 (FIG. 1A) in the z direction during assembly of the carrier 10. In FIG. 1D, the distance z4 by which the clamp 24 can be overdriven, is greater than the height z3 (FIG. 2B) of the opening 80.

The biasing member 20 preferably comprises an elastomeric material that will exert a relatively constant biasing force with continued use in a production environment. In general the amount of the biasing force is a function of the geometry and hardness of the biasing member 20. A representative biasing force for the biasing member 20 can be from 0.25 to 10.0 Kg. The magnitude of the first biasing force, which is initially exerted during assembly of the carrier 10, and the second biasing force in the assembled carrier can be from 2× to 10×.

FIGS. 2D–2G illustrates exemplary peripheral geometries for the biasing member 20 such as square 20S, (FIG. 2D) rectangular 20R, (FIG. 2E) circular 20C (FIG. 2F) and oval 200 (FIG. 2G). The biasing member 20 can include a flat upper surface for facilitating attachment of the biasing member 20 to the clamp 24. In addition, an upper surface of the biasing member 20 can be shaped, or formed with features such a groove, to facilitate attachment of the biasing member 20 to the clamp 24. If desired, an adhesive material, such as a silicone adhesive, can be used to attach the biasing member 20 to the clamp 24. However, for some applications the biasing member 20 and clamp 24 can be in physical contact, but without being adhesively attached to one another.

The biasing member 20 must also be able to resist deformation at temperatures of 100° C. or greater which are encountered during burn-in testing. Representative materials for the biasing member 20 include silicone, butyl rubber, flourosilicone, and polyimide. A representative hardness for the biasing member 20 can be from about 30–90 (Shore A), with and preferably about 60–70 (Shore A).

For some applications the biasing member 20 can comprise a conductive polymer filled with conductive particles. For example, compounds can include silicone or fluorosilicone filled with conductive particles, such as C, Ag, Cu, Al, Cu, and Ni. Conductive polymer materials are commercially available from Chomerics.

Figure 3A:
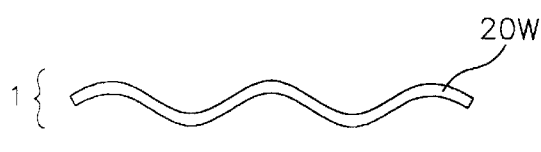
FIG. 3A is a schematic elevation view of an alternate embodiment wave shape biasing member prior to being overdriven in the z-direction.
Figure 3B:
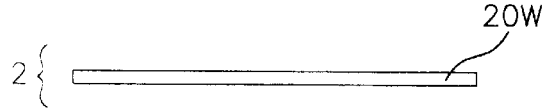
FIG. 3B is a schematic view of the wave shape biasing member shown as flattened and overdriven in the z-direction.

Referring to FIGS. 3A and 3B, an alternate embodiment biasing member 20W is illustrated. The biasing member 20W has a wave shape. Such a shape can also be described as being corrugated or sinusoidal. FIG. 3A illustrates the biasing member 20W as it occurs in the assembled carrier 10. In this configuration the biasing member 20W exerts a biasing force substantially equivalent to segment 1 of the curve in FIG. 2A. FIG. 3B illustrates the biasing member 20W as it occurs as the clamp 24 is overdriven during assembly of the carrier 10. In this configuration the biasing member 20W exerts a biasing force substantially equivalent to segment 2 of the curve in FIG. 2A.

Figure 4A:
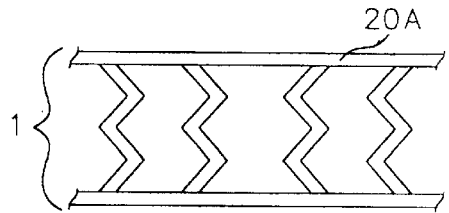
FIG. 4A is a schematic elevation view of an alternate embodiment accordion shape biasing member prior to being overdriven in the z-direction.
Figure 4B:
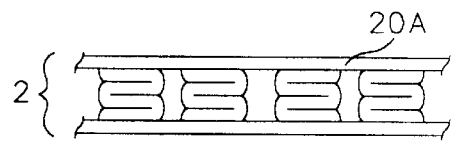
FIG. 4B is a schematic view of the accordion shape biasing member shown as flattened and overdriven in the z-direction.

Referring to FIGS. 4A and 4B, an alternate embodiment biasing member 20A is illustrated. The biasing member 20A has an accordion shape. FIG. 4A illustrates the biasing member 20A as it occurs in the assembled carrier 10. In this configuration the biasing member 20A exerts a biasing force substantially equivalent to segment 1 of the curve in FIG. 2A. FIG. 4B illustrates the biasing member 20A as the clamp 24 is overdriven during assembly of the carrier 10. In this configuration the biasing member 20A exerts a biasing force substantially equivalent to segment 2 of the curve in FIG. 2A.

Figure 5A:
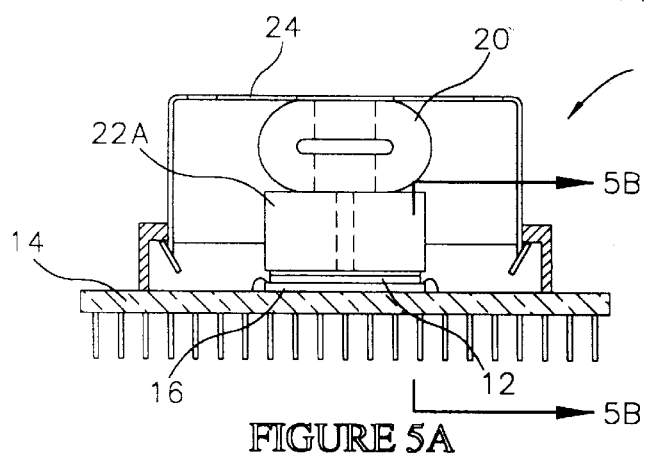
FIG. 5A is a side elevation view of an alternate embodiment carrier having a pressure plate with an elastomeric cushioning layer thereon.
Figure 5C:
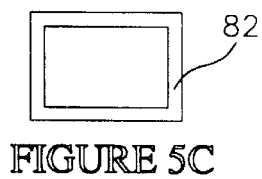
FIG. 5C is a cross sectional view taken along section line 5C—5C of FIG. 5B showing a peripheral outline of the elastomeric cushioning layer.
Figure 5B:
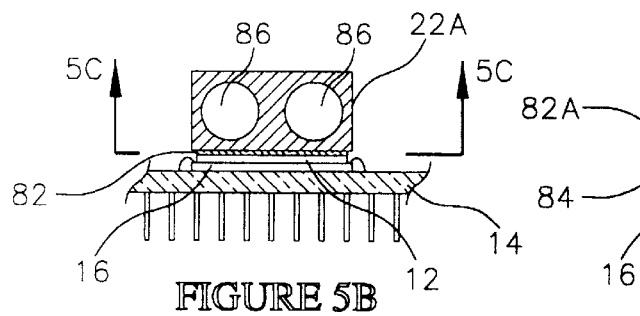
FIG. 5B is an enlarged cross sectional view taken along section line 5B—5B of FIG. 5A showing the pressure plate and elastomeric cushioning layer.

Referring to FIGS. 5A–5C, the carrier 10 is illustrated with an alternate embodiment pressure plate 22A. As shown in FIG. 5A, the pressure plate 22A is assembled within the carrier 10, substantially as previously described for pressure plate 22. However, as shown in FIG. 5B, the pressure plate 22A includes an elastomeric cushioning layer 82 for contacting the component 12. In addition, the pressure plate 22A can include through openings 86 which make the pressure plate 22A lighter.

The cushioning layer 82 functions to cushion and evenly distribute the biasing force applied by the biasing member 20A to the component 12. In addition, the cushioning layer 82 compensates for variations in planarity inherent in the component 12, or variations in planarity due to the mounting of the component 12 within the carrier 10.

A representative thickness for the cushioning layer 82 can be from 0.127 mm (5 mils) to 0.762 mm (30 mils) Suitable materials for the cushioning layer 82 include silicone, fluorosilicone, butyl rubber, and polyimide. For some applications, the cushioning layer 82 can comprise a conductive elastomer, such as a graphite or metal filled silicone material, as previously described.

FIG. 5C illustrates an exemplary frame-like configuration for the cushioning layer 82 with a square peripheral shape. Alternately, the cushioning layer 82 can have other configurations, such as solid, and other peripheral shapes, such as rectangular, circular, or oval.

Figure 5D:
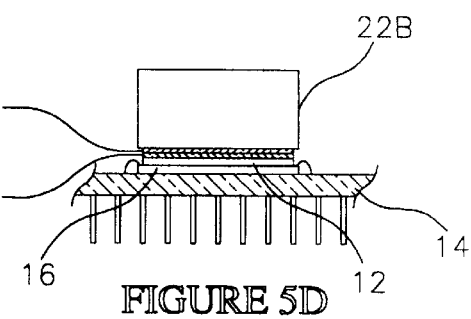
FIG. 5D is an enlarged cross sectional view equivalent to FIG. 5B of an alternate embodiment pressure plate having an elastomeric cushioning layer covered with a metal or polymer layer top prevent adhesion to the component.

Referring to FIG. 5D, another alternate embodiment pressure plate 22B is illustrated. The pressure plate 22B includes a cushioning layer 82A which functions substantially as previously described for cushioning layer 82. However, the cushioning layer 82A includes a non stick layer 84 that prevents adhesion of the cushioning layer 82A, and pressure plate 22B, to the component 12, during disassembly of the carrier 10. The non stick layer 84 can comprise a polymer film that does not contain a silicone component, and which can be deposited or adhered to the pressure plate 22B. Suitable materials include polyimide (e.g., "KAPTON") and PTFE ("TEFLON"). The non stick layer 84 can also comprise a graphite layer, or a metal layer, such as Ag, Cu, Ni, which is deposited onto the cushioning layer 82. Suitable silicone and fluorosilicone materials coated with a thin metal or graphite layer are available from Chomeric.

Figure 6:
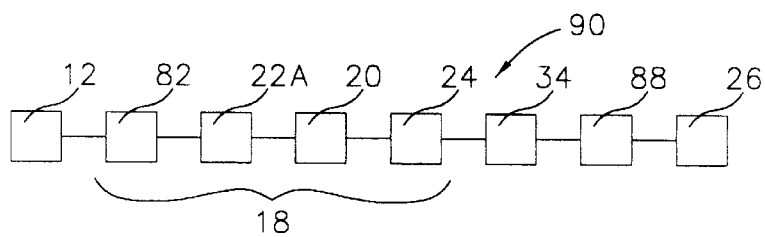
FIG. 6 is an electrical schematic illustrating an electrical path through a force applying mechanism of the carrier.

Referring to FIG. 6, a electrical circuit 90 formed by the force applying mechanism 18 when it is made of electrically conductive materials, is illustrated. The electrical circuit 90 includes the cushioning layer 82, the pressure plate 22A, the biasing member 20, the clamp 24, the clamp ring 34, an internal conductor 88 in the base 14, and a designated terminal lead 26 on the base 14. The electrical circuit 90 can be used to provide an electrical path for grounding, or otherwise electrically connecting to a backside of the component 12. In this application, the cushioning layer 82 can be shaped as required to electrically contact required areas on the component 12, or to contact a pad or other electrical connector on the component 12.

Thus the invention provides an improved semiconductor carrier, a method of for testing semiconductor components using the carrier, a test system incorporating the carrier. Although the invention has been described with reference to certain preferred embodiments, as will be apparent to those skilled in the art, certain changes and modifications can be made without departing from the scope of the invention, as defined by the following claims.

We claim:

1. A method for testing a semiconductor component comprising:

providing a test carrier comprising a base configured to retain the component, an interconnect configured to make electrical connections with the component, and an elastomeric biasing member configured to bias the component and the interconnect together, the biasing member comprising a tubular element having a width, an opening and segments on either side of the opening;

assembling the carrier to provide an assembled carrier containing the component on the interconnect;

flattening the biasing member during the assembly step to close the opening and exert a first biasing force across the width to make the electrical connections;

compressing the biasing member in the assembled carrier to exert a second biasing force across the segments to maintain the electrical connections; and transmitting test signals through the electrical connections to the component.

2. The method of claim 1 wherein the biasing member comprises a material selected from the group consisting of silicone, fluorsilicone, butyl rubber, polyimide and conductive polymer.

3. The method of claim 1 wherein the biasing member comprises a metal or polymer outer layer configured to prevent adhesion to the component.

4. The method of claim 1 wherein the flattening step is performed by overdriving the biasing member in a z-direction.

5. The method of claim 1 wherein the compressing step is performed by selection of a geometry of the carrier and the biasing member.

6. A method for testing a semiconductor component comprising:

providing a test carrier comprising a base configured to retain the component, an interconnect configured to make electrical connections with the component, and an elastomeric biasing member with an accordion shape configured to bias the component and the interconnect together;

assembling the carrier to provide an assembled carrier containing the component on the interconnect;

flattening the biasing member during the assembly step to exert a first biasing force to make the electrical connections;

compressing the biasing member in the assembled carrier into the accordion shape to exert a second biasing force to maintain the electrical connections; and transmitting test signals through the electrical connections to the component.

7. The method of claim 6 wherein the flattening step is performed by overdriving the biasing member in a z-direction.

8. The method of claim 6 wherein the compressing step is performed by selection of a geometry of the carrier and the biasing member.

9. A method for testing a semiconductor component comprising:

providing a carrier configured to hold the component;

providing an interconnect on the carrier configured to make temporary electrical connections with the component;

providing an elastomeric biasing member on the carrier with a wave shape configured to bias the component and the interconnect together;

assembling the carrier to provide an assembled carrier containing the component on the interconnect;

flattening the biasing member during the assembly step to exert a first biasing force to make the electrical connections;

compressing the biasing member in the assembled carrier into the wave shape to exert a second biasing force to maintain the electrical connections; and transmitting test signals through the electrical connections to the component.

10. The method of claim 9 wherein the flattening step is performed by overdriving the biasing member in a z-direction.

11. The method of claim 9 wherein the compressing step is performed by selection of a geometry of the carrier and the biasing member.

12. A method for testing a semiconductor component comprising: providing a test carrier comprising a base configured to retain the component, an interconnect configured to make electrical connections with the component, and an elastomeric biasing member configured to bias the component and the interconnect together, the biasing member having a geometry selected to provide a first biasing force for making the electrical connections and a second biasing force for maintaining the electrical connections;

assembling the carrier to provide an assembled carrier containing the component on the interconnect;

overdriving the biasing member in a z-direction during the assembly step to flatten the biasing member and exert the first biasing force;

compressing the biasing member in the assembled carrier to exert the second biasing force; and transmitting test signals through the electrical connections to the component.

13. The method of claim 12 wherein the geometry of the biasing member and a configuration of the carrier are selected to perform the compressing step.

14. The method of claim 12 wherein the biasing member comprises a tubular element having an opening and segments on either side of the opening configured to exert the second biasing force.

15. The method of claim 12 wherein the biasing member comprise a wave shaped element.

16. The method of claim 12 wherein the biasing member comprise an accordion shaped element.

17. The method of claim 12 wherein the first biasing force is from two to ten times the second biasing force.

18. The method of claim 12 wherein the biasing member comprises a material selected from the group consisting of silicone, fluorsilicone, butyl rubber, polyimide and conductive polymer.

* * * * *